United States Patent
Dakshina-Murthy et al.

(10) Patent No.: US 7,384,569 B1
(45) Date of Patent: Jun. 10, 2008

(54) IMPRINT LITHOGRAPHY MASK TRIMMING FOR IMPRINT MASK USING ETCH

(75) Inventors: Srikanteswara Dakshina-Murthy, Wappingers Falls, NY (US); Bhanwar Singh, Morgan Hill, CA (US); Ramkumar Subramanian, Sunnyvale, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 795 days.

(21) Appl. No.: 10/909,464

(22) Filed: Aug. 2, 2004

(51) Int. Cl.
*G01L 21/30* (2006.01)
*H01L 21/00* (2006.01)

(52) U.S. Cl. .............................. 216/59; 216/41; 216/58; 216/84; 438/689; 438/700; 438/706; 438/725

(58) Field of Classification Search .................. 216/41, 216/58, 84, 59; 430/5; 438/689, 706, 725, 438/589, 700
See application file for complete search history.

(56) References Cited

U.S. PATENT DOCUMENTS

| | | | |
|---|---|---|---|
| 6,472,766 B2 * | 10/2002 | Xiao | 257/797 |
| 6,541,360 B1 * | 4/2003 | Plat et al. | 438/585 |
| 6,573,497 B1 * | 6/2003 | Rangarajan et al. | 250/306 |
| 7,159,205 B1 * | 1/2007 | Amblard et al. | 716/19 |
| 7,186,656 B2 * | 3/2007 | Sreenivasan | 438/700 |
| 2004/0059541 A1 * | 3/2004 | Oishi et al. | 702/150 |
| 2005/0164478 A1 * | 7/2005 | Chan et al. | 438/585 |

* cited by examiner

*Primary Examiner*—Shamim Ahmed
(74) *Attorney, Agent, or Firm*—Amin, Turocy & Calvin, LLP

(57) ABSTRACT

Disclosed are photolithographic systems and methods, and more particularly systems and methodologies that enhance imprint mask feature resolution. An aspect generates feedback information that facilitates control of imprint mask feature size and resolution via employing a scatterometry system to detect resolution enhancement need, and decreasing imprint mask feature size and increasing resolution of the imprint mask via a trim etch procedure.

22 Claims, 10 Drawing Sheets

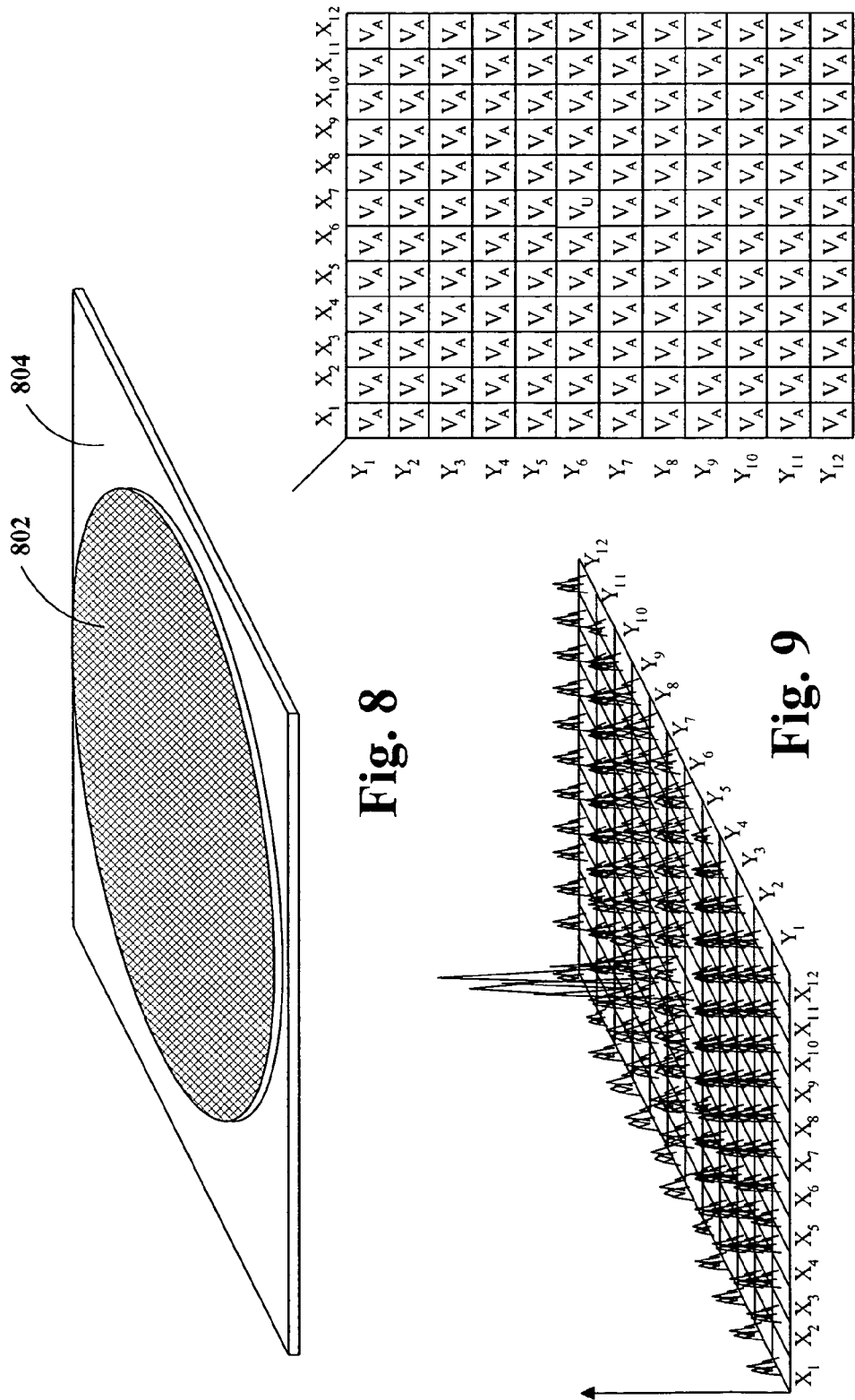

IMPRINT LITHOGRAPHY MASK TRIMMING FOR IMPRINT MASK USING ETCH

TECHNICAL FIELD

The present invention relates generally to photolithographic systems and methods, and more particularly to systems and methodologies that enhance imprint mask feature resolution.

BACKGROUND OF THE INVENTION

As semiconductor trends continue toward decreased size and increased packaging density, every aspect of semiconductor fabrication processes is scrutinized in an attempt to maximize efficiency in semiconductor fabrication and throughput. Many factors contribute to fabrication of a semiconductor. For example, at least one photolithographic process can be used during fabrication of a semiconductor. This particular factor in the fabrication process is highly scrutinized by the semiconductor industry in order to improve packaging density and precision in semiconductor structure.

Lithography is a process in semiconductor fabrication that generally relates to transfer of patterns between media. More specifically, lithography refers to transfer of patterns onto a thin film that has been deposited onto a substrate. The transferred patterns then act as a blueprint for desired circuit components. Typically, various patterns are transferred to a photoresist (e.g., radiation-sensitive film), which is the thin film that overlies the substrate during an imaging process described as "exposure" of the photoresist layer. During exposure, the photoresist is subjected to an illumination source (e.g. UV-light, electron beam, X-ray), which passes through a pattern template, or reticle, to print the desired pattern in the photoresist. Upon exposure to the illumination source, radiation-sensitive qualities of the photoresist permit a chemical transformation in exposed areas of the photoresist, which in turn alters the solubility of the photoresist in exposed areas relative to that of unexposed areas. When a particular solvent developer is applied, exposed areas of the photoresist are dissolved and removed, resulting in a three-dimensional pattern in the photoresist layer. This pattern is at least a portion of the semiconductor device that contributes to final function and structure of the device, or wafer.

As lithographic techniques are pushed to their limits, smaller and smaller critical dimensions (CDs) are desired to maximize chip performance. Thus, chip manufacture is governed largely by wafer CD, which is defined as the smallest allowable width of, or space between, lines of circuitry in a semiconductor device. As methods of wafer manufacture are improved, wafer CD is decreased, which in turn requires finer and finer line edges to be produced, which further requires finer and finer mask features. Furthermore, the resolution of mask features can provide a higher quality product.

SUMMARY OF THE INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The present invention provides for systems and methods that enhance the resolution of features on an imprint mask. More specifically, the systems and methods of the invention can decrease the feature size on the imprint mask in order to improve imprint mask resolution and performance. That is, the enhancement of the resolution on imprint masks maximizes imprint mask capabilities and ultimately improves chip performance.

According to an aspect of the invention, an imprint mask can be monitored to detect the presence of a resolution enhancement need. A monitor component, such as, for example, a scatterometry system, can provide real-time information regarding the status of features on the imprint mask. If a resolution enhancement need is detected, a control component can provide a trim etch process on the mask in order to selectively decrease feature size to increase the resolution of the imprint mask. The control component can make determinations regarding whether resolution enhancement is necessary, whether the resolution enhancement could be potentially detrimental to a wafer, whether compensatory action was successful in increasing the resolution of the imprint mask and features, etc., based on information received from the monitor component.

According to another aspect of the invention, inferences can be made regarding, for example, whether to initiate compensatory action to correct detected resolution enhancement need. Such inferences can be based on, for example, information related to the severity of the inefficient resolution of the imprint mask features, current resolution of imprint mask features and target resolution of the imprint mask features, the location of detected resolution enhancement need, etc. For instance, a mask that has more than a predetermined threshold number of resolution requirements for the imprint mask features can be scrapped in order to ensure that quality control standards are adhered to. Similarly, a resolution enhancement need that is detected in a non-critical area of an imprint mask can be ignored, thus saving costs and time associated with compensating. This aspect of the invention permits greater efficiency and economic benefit by augmenting the criteria germane to making a decision regarding compensating for potentially destructive features on an imprint mask.

To the accomplishment of the foregoing and related ends, certain illustrative aspects of the invention are described herein in connection with the following description and the annexed drawings. These aspects are indicative, however, of but a few of the various ways in which the principles of the invention can be employed and the present invention is intended to comprise all such aspects and their equivalents. Other advantages and novel features of the invention will become apparent from the following detailed description of the invention when considered in conjunction with the drawings.

BRIEF DESCRIPTION OF THE DRAWINGS

FIG. 8 illustrates a perspective view of a grid-mapped mask according to one or more aspects of the present invention.

FIG. 9 illustrates plots of measurements taken at grid-mapped locations on a mask in accordance with one or more aspects of the present invention.

FIG. 10 illustrates a table containing entries corresponding to measurements taken at respective grid-mapped locations on a mask in accordance with one or more aspects of the present invention.

DETAILED DESCRIPTION OF THE INVENTION

Figure 1:
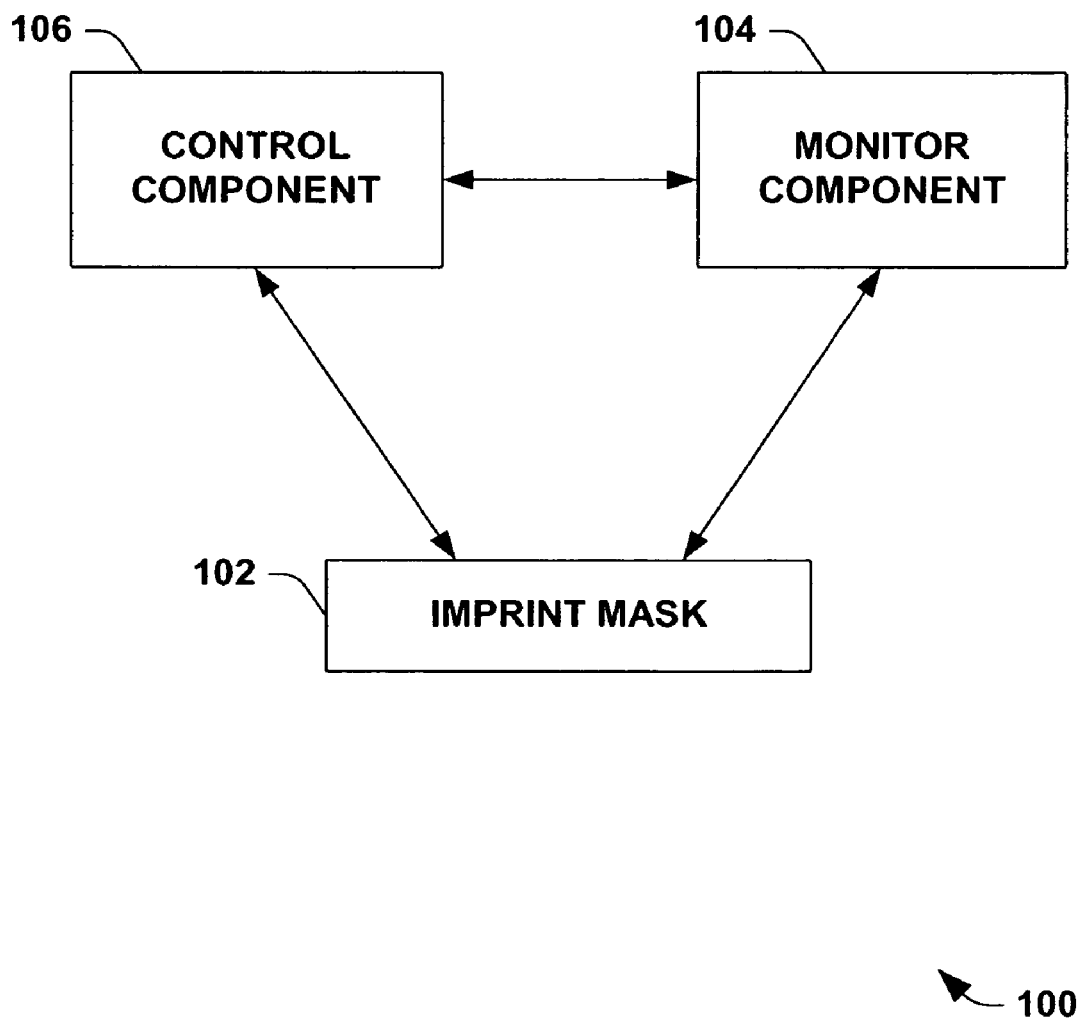
FIG. 1 is an illustration of an imprint mask resolution enhancement system in accordance with an aspect of the present invention.

The present invention will now be described with reference to the drawings, wherein like reference numerals are used to refer to like elements throughout. The present invention will be described with reference to systems and methods for mitigating retrograde profiles on imprint mask features. It should be understood that the description of these exemplary aspects are merely illustrative and that they should not be taken in a limiting sense.

The term "component" refers to a computer-related entity, either hardware, a combination of hardware and software, software, or software in execution. For example, a component can be a process running on a processor, a processor, an object, an executable, a thread of execution, a program and a computer. By way of illustration, both an application running on a server and the server can be components. A component can reside in one physical location (e.g., in one computer) and/or can be distributed between two or more cooperating locations (e.g., parallel processing computer, computer network).

It is to be appreciated that various aspects of the present invention can employ technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks, and function link networks) can be employed.

Imprint lithography uses a patterned mask to "imprint" a pattern on a resist at a 1:1 feature size ratio. Imprint mask integrity must be maintained throughout the lithography process because any flaw or structural defect present on a patterned imprint mask can be indelibly transferred to underlying layers during imprinting of a photoresist. Moreover, imprint mask feature resolution can be equally important allowing the mask features to properly transfer to the image layer.

FIG. 1 illustrates an imprint mask resolution enhancement system 100 in which imprint mask features are modified allowing for decreased feature size. For example, the imprint mask 102 can be, but not limited to, a quartz material. The imprint mask 102 coupled to a monitor component 104 provides the detection of the need to enhance the resolution of imprint mask features on the imprint mask 102 during and/or after fabrication. For example, the monitor component 104 can monitor aspects and/or conditions associated with the imprint mask 102 during fabrication and/or prior to imprinting a wafer in order to glean information associated with the resolution of imprint mask features. Such information can be relayed to the control component 106 for analysis. If information gathered by the monitor component 104 is indicative of a need to enhance the resolution of the imprint mask features, the control component 106 can initiate compensatory action to augment the imprint mask 102 to increase the resolution of the mask features. Upon detection of an imprint mask feature resolution increase from the monitor component 104, the control component 106 employs the resolution enhancement of the imprint mask 102. The control component 106 increases the resolution of the imprint mask features by providing a trim etch process (e.g., wet or dry etch) on the imprint mask 102 allowing the imprint mask features to be minimized. By using a trim etch to enhance the imprint mask features on the imprint mask 102, the gaps between the imprint mask features are increased which ultimately leads to an enhancement of the imprint mask resolution when used within imprint lithography.

To further this example, if the monitor component 104 detects a condition indicative of a resolution enhancement of imprint mask 102 and associated features, then the control component 106 can utilize a trim etch process (e.g., wet or dry etch) to selectively etch, for example, the quartz imprint mask and associated features. The control component 106 can selectively etch the imprint mask features in a manner that decreases the imprint mask feature size increasing the resolution of the imprint mask 102. Thus, the imprint mask resolution can be enhanced to improve integrity and product quality.

The present invention can utilize a trim etch process in order to enhance the resolution of the imprint mask and the associated imprint mask features. The etching process removes selected areas from the imprint mask 102. For example, "dry" (e.g., plasma) etching can be used for critical circuit-defining steps, while "wet" etching (e.g., using chemical baths) is mainly used to clean wafers. Dry etching is one of the most frequently used processes in semiconductor manufacturing. Before etching begins, a target area (e.g., imprint mask) is coated with photoresist and exposed to a circuit pattern during photolithography. Etching removes material only from areas dictated by the photoresist pattern. Plasma etching is performed by applying an electrical field to a gas containing some chemically reactive element (e.g., fluorine or chlorine). The plasma releases chemically reactive ions that can remove or etch materials quickly. In addition, the chemicals are given an electric charge, which directs them vertically. This allows the achievement of nearly perfect vertical etching profiles, a critical characteristic for etching features within photolithography.

The present invention is not limited to performing the trim etch protocol described above on a quartz imprint mask, but rather can employ any suitable material utilized for an imprint mask within photolithography. For example, it is to be appreciated if the mask is formed of a chrome substrate, than any suitable trim etch process whose properties are compatible with chrome can be employed by the present invention.

It is to be appreciated that the monitor component 104 can be, for example, a scatterometry component. An advantage associated with employing a scatterometry system to monitor an imprint mask is that retrograde profiles on mask features can be detected without requiring cross-sectioning of the mask. The present invention contemplates any suitable scatterometry component and/or system, and such systems are intended to fall within the scope of the hereto-appended claims. It is further to be appreciated that the monitoring component 104 utilized by the present invention can be, for example, a Scanning Electron Microscope (SEM), a Critical Dimension Scanning Electron Microscope (CD-SEM), a Field Effect Scanning Electron Microscope (FESEM), an In-Lens FESEM, or a Semi-In-Lens FESEM, depending on the desired magnification and precision. For example, FESEM permits greater levels of magnification and resolution at high or low energy levels by rastering a narrower electron beam over the sample area. FESEM thus permits quality resolution at approximately 1.5 nm. Because FESEM can produce high-quality images at a wide range of accelerating voltages (typically 0.5 kV to 30 kV), it is able to do so without inducing extensive electrical charge in the sample. Furthermore, conventional SEM cannot accurately image an insulating material unless the material is first coated with an electrically conductive material. FESEM mitigates the need to deposit an electrically conductive coating prior to scanning. According to another example, the monitor component 104 of the present invention can be In-Lens FESEM, which is capable of 0.5 nm resolution at an accelerating voltage of 30 kV, or any other suitable type of scanner, such as Transmission Electron Microscopy (TEM), Atomic Force Microscopy (AFM), Scanning Probe Microscopy (SPM), etc.

Moreover, the control component 106 can provide larger gaps between the imprint mask features which ultimately lead to increased resolution in imprint lithography. For example, an imprint mask can be fabricated with a gap distance of X between two imprint mask features. The imprint mask can be enhanced in such a manner to provide the gap distance X an additional distance Y to meet a target distance of Z. In other words, an imprint mask with a gap of X can be increased a distance Y based on at least an enhance request providing the imprint mask gap distance should be Z. Thus, the control component 106 can employ the necessary enhancements (e.g., wet or dry trim etch processes) in order to increase the gap distance between imprint mask features in the mask providing an increase in resolution and further reduction for contact holes.

Figure 2:
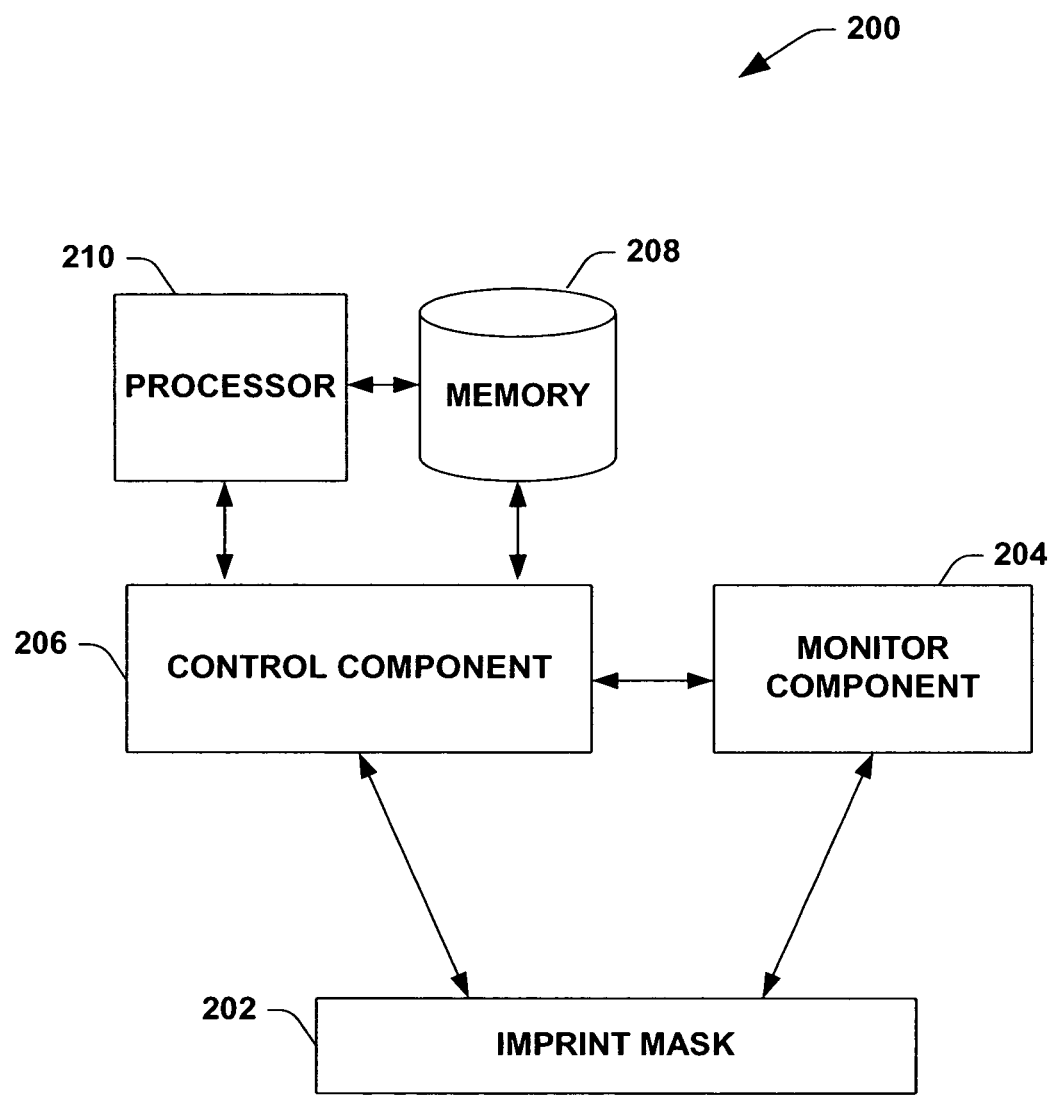
FIG. 2 is an illustration of an imprint mask resolution enhancement system in accordance with an aspect of the present invention comprising a processor and a memory.

Now referring to FIG. 2, an illustration of an imprint mask resolution enhancement system 200 provides the decrease of imprint mask features in which the resolution of the imprint mask is increased. The control component 206 is operatively associated with a processor 210 and a memory 208, both of which are operably coupled to each other. It is to be understood that a that the processor 210 can be a processor dedicated to determining whether enhancement of the imprint mask 202 is necessary, a processor used to control one or more of the components of the present system(s), or, alternatively, a processor that is used to determine whether enhancement of the imprint mask 202 is necessary and to control one or more of the components of the imprint mask resolution enhancement system 200.

The memory component 208 can be employed to retain mask identification information, mask profile and lateral line dimensions, mask CD, semiconductor fabrication data, etc. Furthermore, the memory 208 can be either volatile memory or nonvolatile memory, or can comprise both volatile and nonvolatile memory. By way of illustration, and not limitation, nonvolatile memory can comprise read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory 208 of the present systems and methods is intended to comprise, without being limited to, these and any other suitable types of memory.

Figure 3:
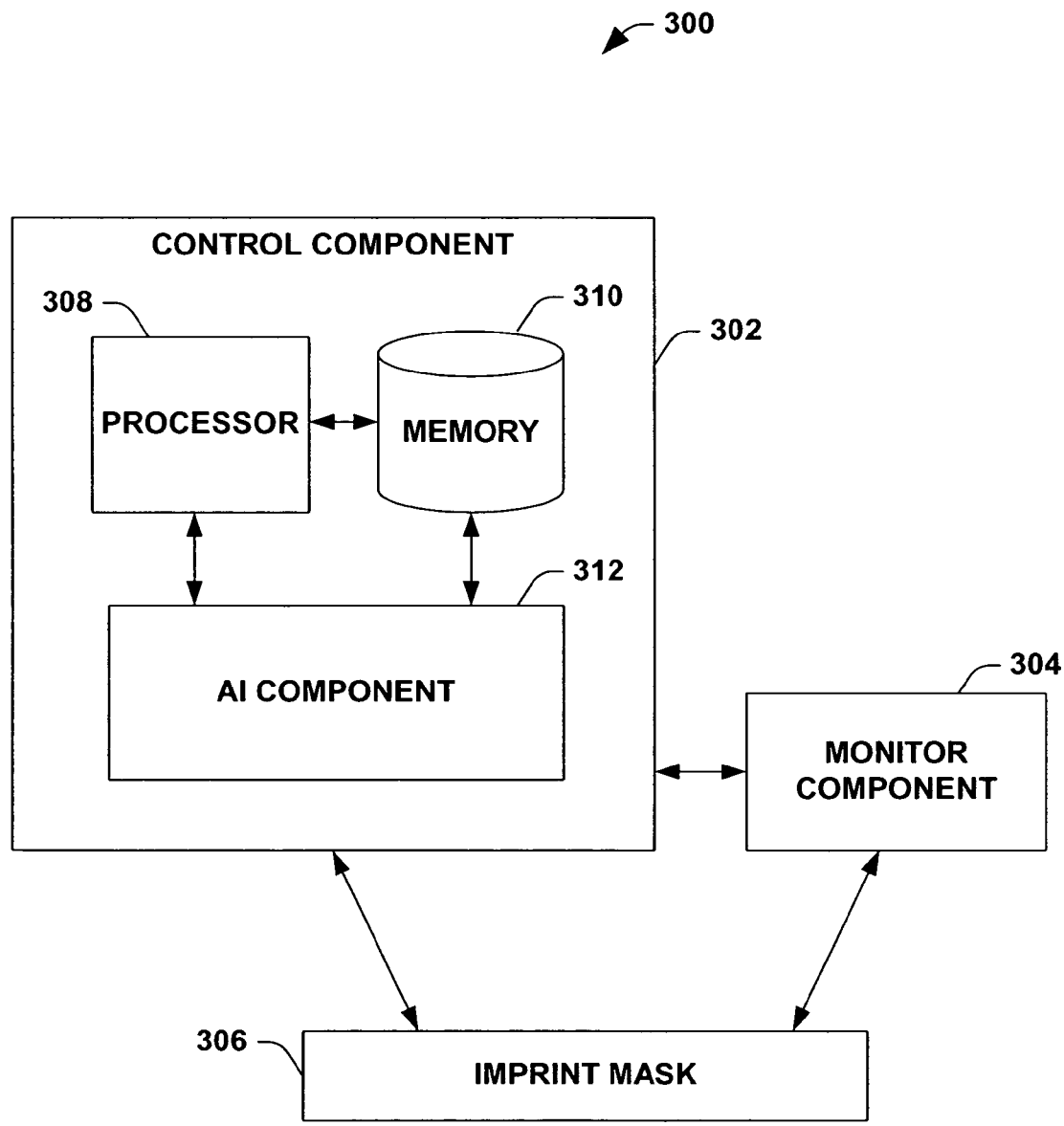
FIG. 3 is an illustration of an imprint mask resolution enhancement system in accordance with the present invention wherein a modification component further comprises an artificial intelligence component

FIG. 3 is an illustration of an imprint mask resolution enhancement system 300 in accordance with an aspect of the present invention. The imprint mask resolution enhancement system 300 can employ various inference schemes and/or techniques in connection with enhancing the resolution by shrinking imprint mask feature sizes. As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the subject invention.

Still referring to FIG. 3, the imprint mask resolution enhancement system 300 comprises a control component 302 that is operatively coupled to a monitor component 304. The monitor component 304 monitors the status of an imprint mask 306 and transmits data associated therewith to the control component 302. The control component 302 comprises a processor 308 that can analyze data received from the monitor component 304, and a memory component 310 that can store information related to various aspects of the imprint mask 306. The control component 302 also comprises an artificial intelligence (AI) component 312 that can make inferences regarding system operation, such as whether and/or to what extent resolution compensation should be taken to enhance the imprint mask features on the imprint mask 306.

For example, the AI component 312 can determine an optimal duration for employing the trim etch process, the optimal process to be used (e.g., dry or wet etch process), the amount of etch to be done on an imprint mask requiring resolution enhancement, etc. According to another example, the AI component 312 can make inferences regarding whether the resolution of the imprint mask features will adversely affect a wafer based on, for instance, location, current resolution of imprint mask features and target resolution of the imprint mask features, etc. These examples are given by way of illustration only and are not in any way intended to limit the scope of the present invention or the number of, or manner in which the AI component makes, inferences.

Figure 4:
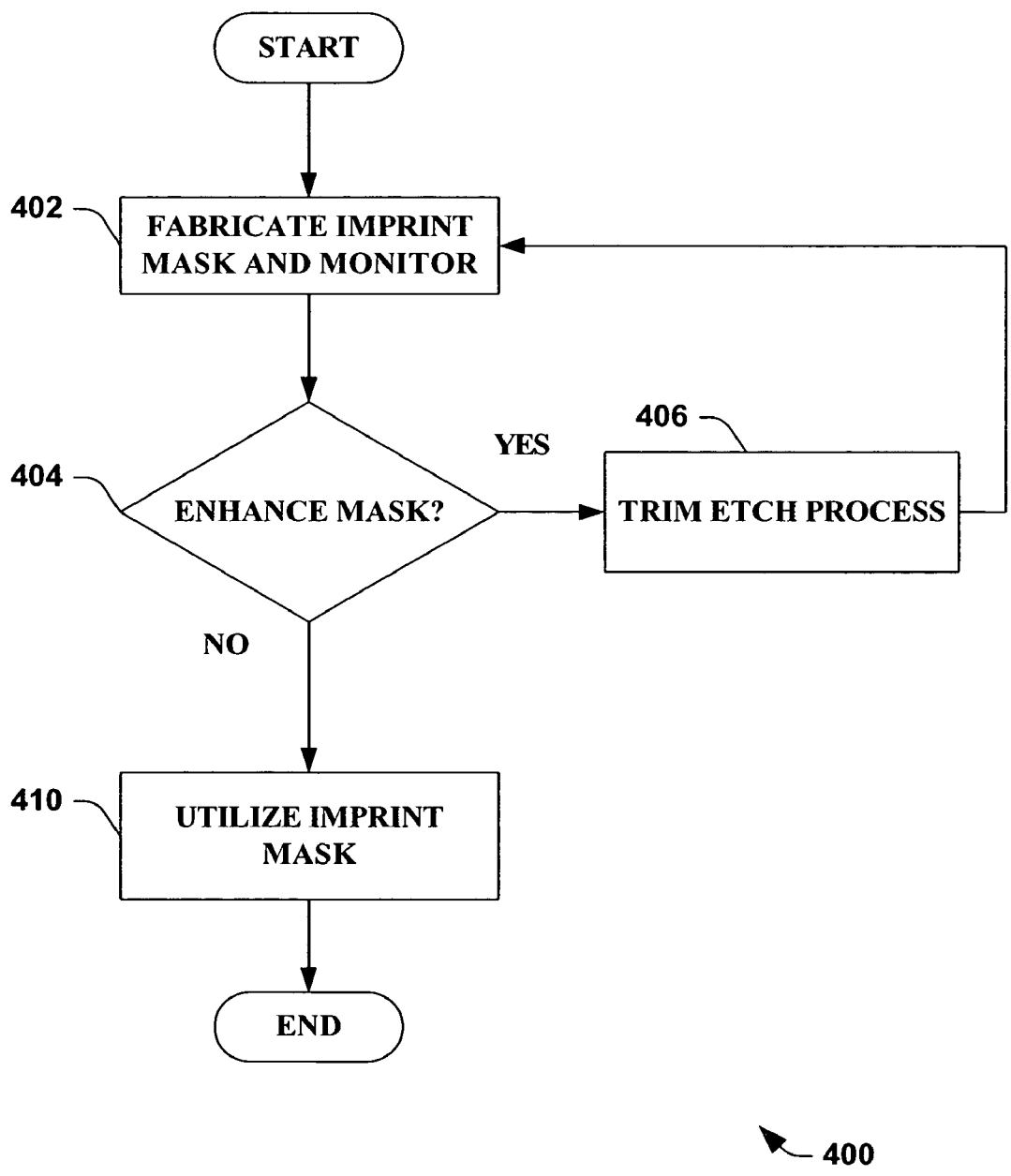
FIG. 4 is an illustration of a flow diagram of a methodology in accordance with an aspect of the present invention.
Figure 5:
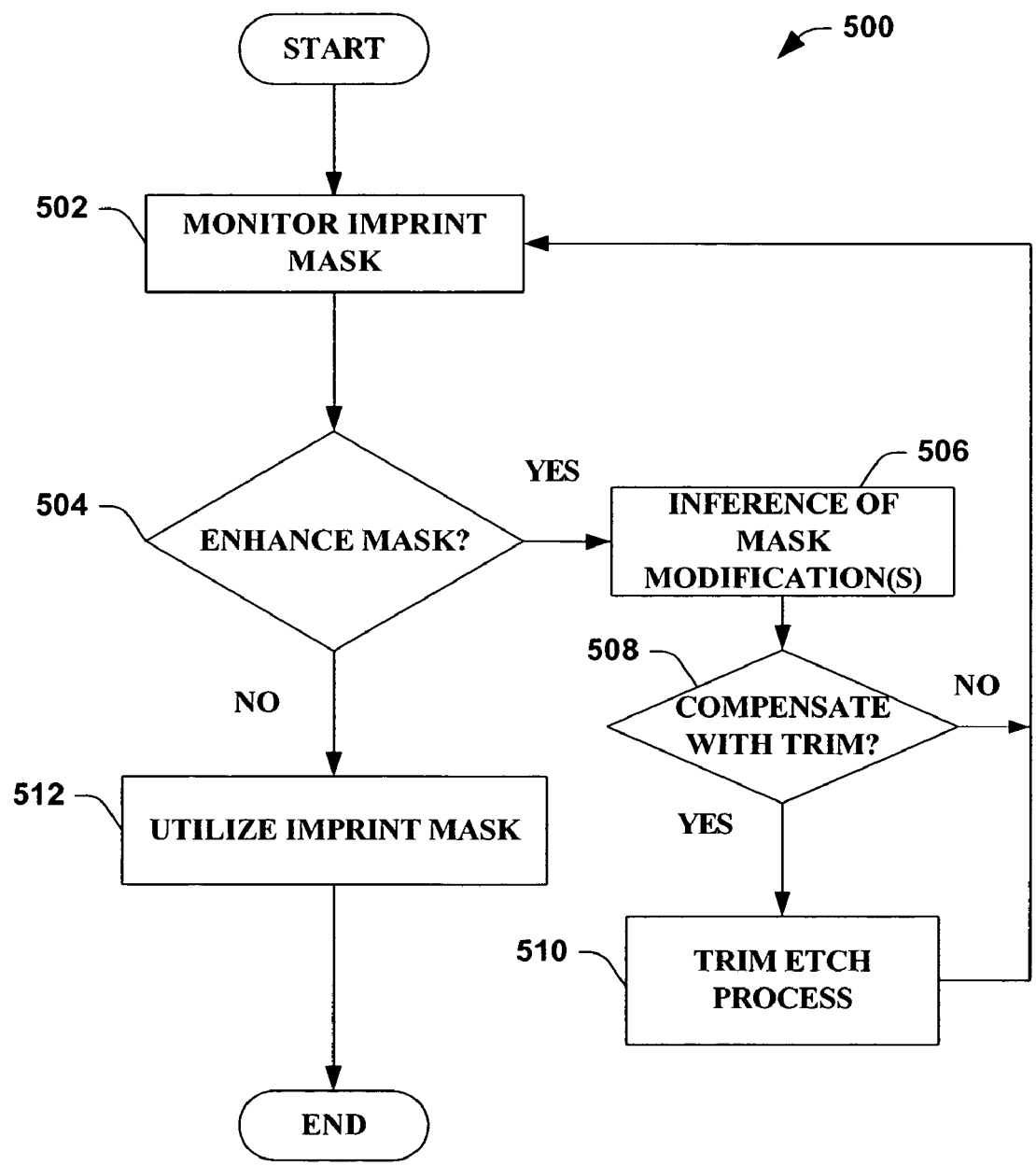
FIG. 5 is an illustration of a flow diagram of a methodology in accordance with an aspect of the present invention.

Now turning to FIGS. 4 and 5, methodologies that can be implemented in accordance with the present invention are illustrated. While, for purposes of simplicity of explanation, the methodologies are shown and described as a series of blocks, it is to be understood and appreciated that the present invention is not limited by the order of the blocks, as some blocks can, in accordance with the present invention, occur in different orders and/or concurrently with other blocks from that shown and described herein. Moreover, not all illustrated blocks may be required to implement the methodologies in accordance with the present invention.

FIG. 4 is an illustration of a methodology 400 in accordance with an aspect of the present invention. At 402, an imprint mask is fabricated and monitored for any possible resolution requirements and/or adjustments. The imprint mask is monitored via, for example, a scatterometry system. Scatterometry offers several advantages over other monitoring methods, including but not limited to, an ability to detect resolution requirements without requiring a cross-sectional image of an imprint mask. At 404, a determination is made whether or not to enhance the imprint mask. For example, imprint mask resolution enhancement need can be based upon, resolution increase request, resolution transgression, achieved resolution versus target resolution, etc. If it is determined at 404 that no resolution enhancement(s) are necessary to the imprint mask, then the methodology can proceed to 410, where the imprint mask is further utilized. If the resolution enhancement of the imprint mask is needed at 404, the methodology proceeds to 406, where a trim etch process can be employed. The trim etch process can be a dry etch or a wet etch. The trim etch process provides the shrinking of imprint mask feature size allowing for an increase in the resolution of the imprint mask and ultimately a further reduction for contact holes. For example, the trim etch process can remove quartz material from a selected imprint mask feature from the imprint mask creating a smaller imprint mask feature. It is to be appreciated that quartz is an exemplary material for the imprint mask, however, any suitable material (e.g., fused-silica, chrome, etc.) having properties consistent with those of the trim etch process chosen (e.g., dry, wet, etc.) can be utilized, and the present invention contemplates any and all such materials and processes. The methodology can then revert to 402 for further monitoring and imprint mask detection to ensure that the resolution compensation measures were successful.

FIG. 5 is an illustration of a methodology 500 in accordance with an aspect of the present invention. An imprint mask is monitored via, for example, a scatterometry system, at 502. At 504, a determination is made as to whether, for example, the imprint mask resolution enhancement is necessary. If no resolution enhancement is necessary for the imprint mask at 504, then the imprint mask can be utilized to continue the wafer imprint process at 512. If the imprint mask resolution enhancement is necessary at 504, then inferences can be made regarding whether to take corrective action at 506. At 508, a determination is made regarding whether to initiate resolution compensation measures on the imprint mask feature(s), based at least in part on inferences made at 506. For example, an imprint mask can be monitored and have a resolution increase request detected. Yet such resolution increase detection can be such that it will not adversely affect a wafer imprinted by the imprint mask. Inferences regarding, for example, the location of the resolution deficiency on the imprint mask, severity of the resolution discrepancy (e.g., target resolution of imprint mask features versus achieved resolution of imprint mask features), etc., can be utilized to determine whether the resolution enhancement action is necessary. If it is determined that the particular detected imprint mask resolution discrepancy will not be detrimental to the wafer upon imprinting, then the imprint mask can be utilized to imprint a wafer at 512. If it is determined that the imprint mask requires compensatory action, then the methodology can proceed to 510, where a trim etch process can be employed providing the imprint mask feature sizes to decrease which ultimately increased resolution. The trim etch process can be, for example, a wet or dry etch process. Once the trim etch process is complete, the system can revert to 502 for further monitoring in order to verify that the resolution compensation measure is successful. If so, then at 504, no resolution enhancement is required and the imprint mask can be approved for use.

Figure 6:
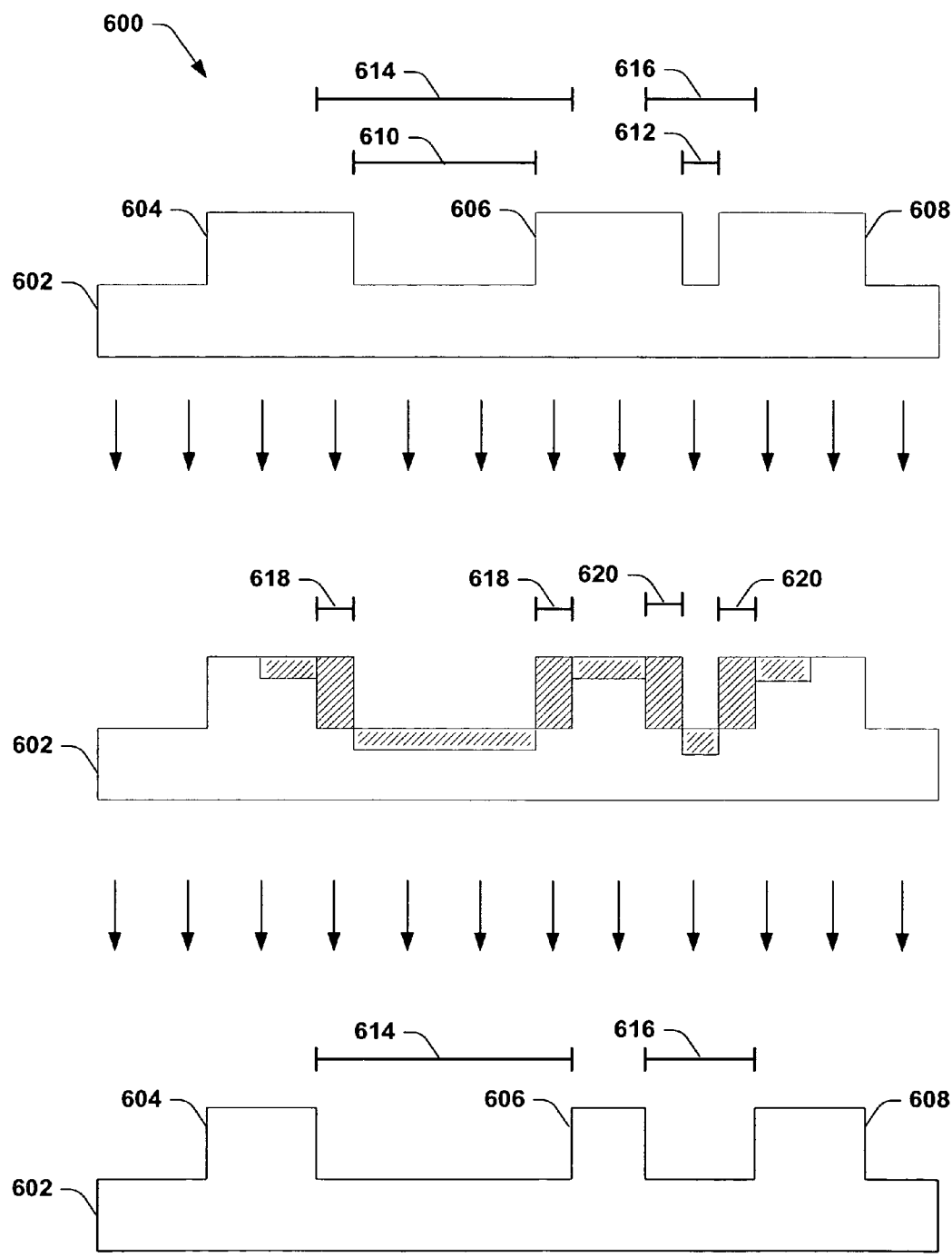
FIG. 6 illustrates a cross-sectional view of an imprint mask having a resolution enhancement need undergoing a trim etch procedure to compensate for the resolution enhancement need.

FIG. 6 is a cross-sectional view 600 of a post fabrication imprint mask 602 having features 604, 606, and 608 that exhibit various profiles. Furthermore, the imprint mask 602 contains a resolution discrepancy between and/or on at least one imprint mask feature. For example, an imprint mask can have resolution discrepancy between features 604 and 606, and 606 and 608 respectively. Between features 604 and 606, an achieved gap distance 610 is shown as well as a target gap distance 614. In other words, dealing with features 604 and 606, the achieved gap distance 610 minus the target gap distance 614 yields the amount of decrease in feature size that would reflect the requested amount of resolution increase. Similarly, an achieved gap distance 612 between features 606 and 608 can have a target gap distance 616. Thus, the achieved gap distance 612 minus the target gap distance 716 results in the amount of decrease in feature size necessary to achieve the resolution increase on the imprint mask.

FIG. 6 further illustrates a cross-section 600 of a portion of an imprint mask 602 exhibiting an imprint mask that requires resolution enhancement. A trim etch process (e.g., wet or dry etch, which is isotropic in nature) can be employed on the imprint mask 602, illustrated by a set of inverted arrows. The trim etch process can remove the portions necessary in order to achieve the correct resolution by means of shrinking the imprint mask features. For example, the resolution required between imprint mask features 604 and 606 can be achieved by etching away the access distance 618 on each imprint mask feature 604 and 606. It is to be appreciated that the access distance 618 can vary from feature to feature (e.g., the access distance is not required to be symmetrical within the gap between each feature). Similarly, the resolution required between imprint mask features 604 and 606 can be acquired with the removal of the access distance 620 on the imprint mask features 606 and 608. It is also to be appreciated that the access distance 620 required for resolution to imprint mask features 606 and 608 need not be equivalent and/or related to access distance 618. Upon completion of the trim etch process, shown by the second set of arrows, the gap distance between features 604, 606, and 608 has increased to the target gap distances 614 and 616 respectively.

Still referring to FIG. 6, the trim etch process (e.g., wet or dry) provides the enhancement of the imprint mask 602 by increasing the resolution capabilities. The achieved gap distance 610 is corrected by the trim etch process such that the target gap distance 614 is reached providing greater resolution. Likewise, the achieved gap distance 612 is corrected by the trim etch process until the achieved gap distance 612 is equal to the target gap distance 616. In addition to increasing the resolution of the imprint mask 602 and the imprint mask features 604, 606 and 608, the present invention provides further reduction for contract holes.

It should be noted that the height of the imprint mask features are on the order of about 100 s of nm, with the features themselves being on the order of 10 s of nm (dimensions at which imprint litho is likely to be used). Hence, corrections are expected to be only of the order of about 5 to about 10 nm. This implies that the deviations to the imprint mask due to isotropic etch components should be minimal. The corrections needed on the imprint mask cause some recession in the height of the features. However, the order of the corrections is only about 10 nm for example, whereas the height of the features is on the order of about 100 s of nm. Hence, the deviations shown in FIG. 6 (and FIG. 7 below) are clearly not to scale. The extent of trim correction is highly exaggerated because features are not drawn to scale (in reality, the vertical is much larger than the horizontal). Consequently, vertical loss is insignificant since CD is more important than height of a given resist feature.

Figure 7:
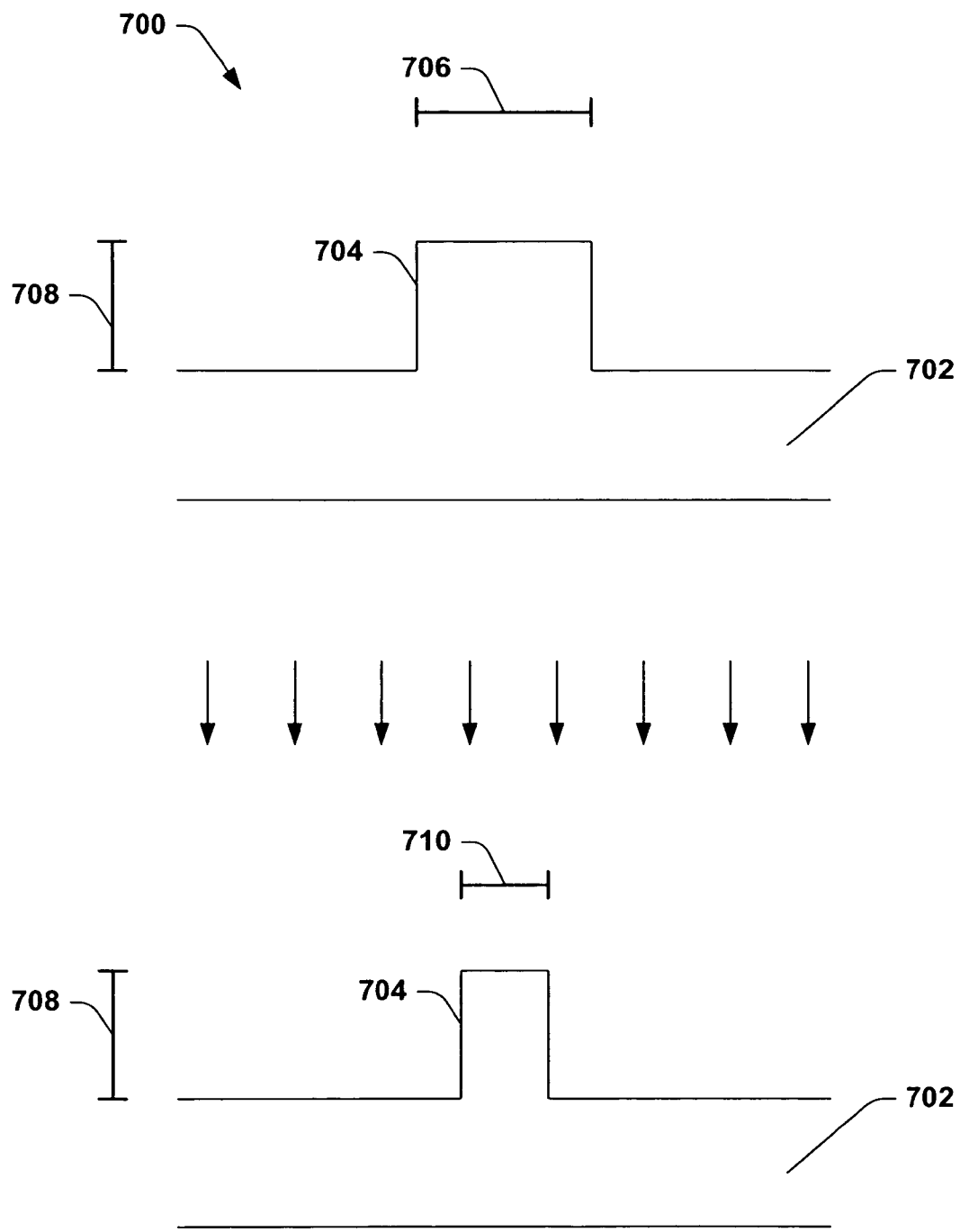
FIG. 7 illustrates a cross-sectional view of an imprint mask having a resolution enhancement need undergoing a trim etch procedure to compensate for the resolution enhancement need.

Now turning to FIG. 7, a cross-sectional view 700 of a post fabrication imprint mask 702 having a feature 704 is illustrated. The imprint mask feature 704 is shown with an achieved height 708 and an achieved width 706. The imprint mask feature 704 can be decreased in size in order to enhance the resolution of the imprint mask 702. If a resolution compensation measure is requested, a trim etch process can be utilized as shown by the set of arrows. The trim etch process is isotropic in nature, but the modification in height is insignificant whereas the modification to width is significant. Upon completion of the trim etch process, the imprint mask feature 704 can be decreased to a target width 710 (since the decrease in height is insignificant, it is not shown). The target width 710 can be achieved by etching (e.g., dry or wet etch) any portion of the imprint mask feature. In other words, the present invention is not limited to etching symmetrically.

Turning now to FIGS. 8-10, in accordance with one or more aspects of the present invention, a mask 802 (or one or more die located thereon) situated on a stage 804 can be logically partitioned into grid blocks to facilitate concurrent measurements of critical dimensions and overlay as the mask matriculates through a semiconductor fabrication process. This can facilitate selectively determining to what extent, if any, fabrication adjustments are necessary. Obtaining such information can also assist in determining problem areas associated with fabrication processes.

FIG. 8 illustrates a perspective view of the steppable stage 804 supporting the mask 802. The mask 802 can be divided into a grid pattern as shown in FIG. 8. Each grid block (XY) of the grid pattern corresponds to a particular portion of the mask 802 (e.g., a die or a portion of a die). The grid blocks are individually monitored for fabrication progress by concurrently measuring critical dimensions and overlay with either scatterometry or scanning electron microscope (SEM) techniques.

This can also be applicable in order to assess mask-to-mask and lot-to-lot variations. For example, a portion P (not shown) of a first mask (not shown) can be compared to the corresponding portion P (not shown) of a second mask. Thus, deviations between masks and lots can be determined in order to calculate adjustments to the fabrication components that are necessary to accommodate for the mask-to-mask and/or lot-to-lot variations.

In FIG. 9, one or more respective portions of the mask 802 ($X_1Y_1 \ldots X_{12}, Y_{12}$) are concurrently monitored for critical dimensions and overlay utilizing either scatterometry or scanning electron microscope techniques. Exemplary measurements produced during fabrication for each grid block are illustrated as respective plots. The plots can, for example, be composite valuations of signatures of critical dimensions and overlay. Alternatively, critical dimensions and overlay values can be compared separately to their respective tolerance limits.

As can be seen, the measurement at coordinate $X_7Y_6$ yields a plot that is substantially higher than the measurement of the other portions XY. This can be indicative of overlay, overlay error, and/or one or more critical dimension(s) outside of acceptable tolerances. As such, fabrication components and/or operating parameters associated therewith can be adjusted accordingly to mitigate repetition of this aberrational measurement. It is to be appreciated that the mask 802 and or one or more die located thereon can be mapped into any suitable number and/or arrangement of grid blocks to effectuate desired monitoring and control.

FIG. 10 is a representative table of concurrently measured critical dimensions and overlay taken at various portions of the mask 802 mapped to respective grid blocks. The measurements in the table can, for example, be amalgams of respective critical dimension and overlay signatures. As can be seen, all the grid blocks, except grid block $X_7Y_6$, have measurement values corresponding to an acceptable value ($V_A$) (e.g., no overlay error is indicated and/or overlay measurements and critical dimensions are within acceptable tolerances), while grid block $X_7Y_6$ has an undesired value ($V_U$) (e.g., overlay and critical dimensions are not within acceptable tolerances, thus at least an overlay or CD error exists). Thus, it has been determined that an undesirable fabrication condition exists at the portion of the mask 802 mapped by grid block $X_7Y_6$. Accordingly, fabrication process components and parameters can be adjusted as described herein to adapt the fabrication process accordingly to mitigate the re-occurrence or exaggeration of this unacceptable condition.

Alternatively, a sufficient number of grid blocks can have desirable thickness measurements so that the single offensive grid block does not warrant scrapping the entire mask. It is to be appreciated that fabrication process parameters can be adapted so as to maintain, increase, decrease and/or qualitatively change the fabrication of the respective portions of the mask 802 as desired. For example, when the fabrication process has reached a pre-determined threshold level (e.g., X % of grid blocks have acceptable CDs and no overlay error exists), a fabrication step can be terminated.

Figure 11:
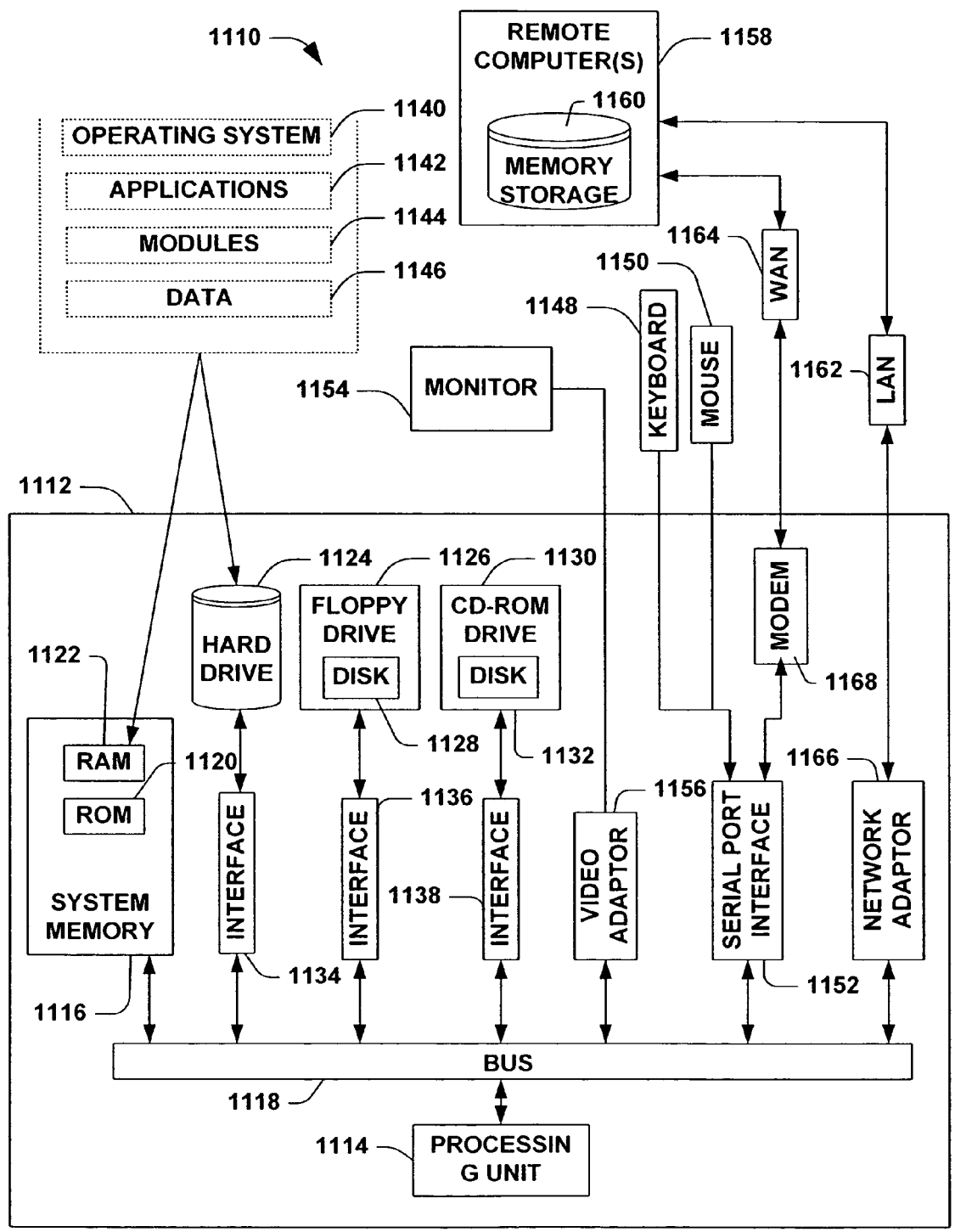
FIGS. 11 and 12 are illustrations of exemplary computing systems and/or environments in connection with facilitating employment of the subject invention.
Figure 12:
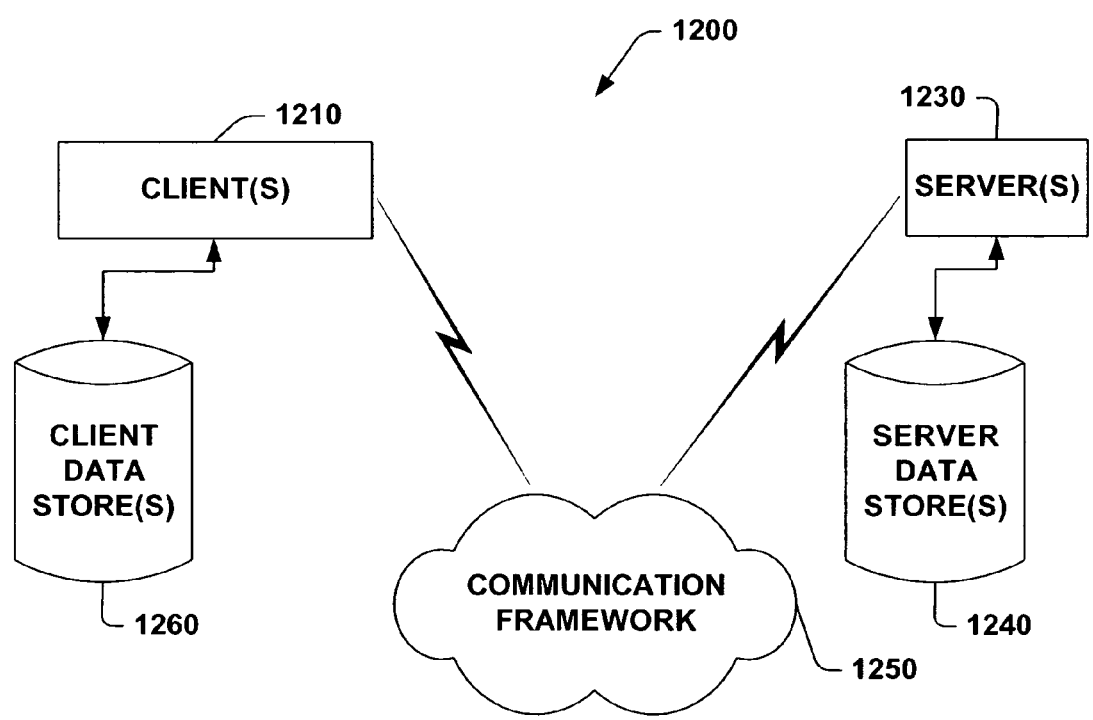

In order to provide a context for the various aspects of the invention, FIGS. 11 and 12 as well as the following discussion are intended to provide a brief, general description of a suitable computing environment in which the various aspects of the present invention can be implemented. While the invention has been described above in the general context of computer-executable instructions of a computer program that runs on a computer and/or computers, those skilled in the art will recognize that the invention also can be implemented in combination with other program modules.

Generally, program modules include routines, programs, components, data structures, etc. that perform particular tasks and/or implement particular abstract data types. Moreover, those skilled in the art will appreciate that the inventive methods can be practiced with other computer system configurations, including single-processor or multiprocessor computer systems, mini-computing devices, mainframe computers, as well as personal computers, hand-held computing devices, microprocessor-based or programmable consumer electronics, and the like. The illustrated aspects of the invention can also be practiced in distributed computing environments where tasks are performed by remote processing devices that are linked through a communications network. However, some, if not all, aspects of the invention can be practiced on stand-alone computers. In a distributed computing environment, program modules can be located in both local and remote memory storage devices.

With reference to FIG. 11, an exemplary environment 1110 for implementing various aspects of the invention includes a computer 1112. The computer 1112 includes a processing unit 1114, a system memory 1116, and a system bus 1118. The system bus 1118 couples system components including, but not limited to, the system memory 1116 to the processing unit 1114. The processing unit 1114 can be any of various available processors. Dual microprocessors and other multiprocessor architectures also can be employed as the processing unit 1114.

The system bus 1118 can be any of several types of bus structure(s) including the memory bus or memory controller, a peripheral bus or external bus, and/or a local bus utilizing any variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

The system memory 1116 includes volatile memory 1120 and nonvolatile memory 1122. The basic input/output system (BIOS), comprising the basic routines to transfer information between elements within the computer 1112, such as during start-up, is stored in nonvolatile memory 1122. By way of illustration, and not limitation, nonvolatile memory 1122 can include read only memory (ROM), programmable ROM (PROM), electrically programmable ROM (EPROM), electrically erasable ROM (EEPROM), or flash memory. Volatile memory 1120 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 1112 also includes removable/non-removable, volatile/non-volatile computer storage media. FIG. 11 illustrates, for example a disk storage 1124. Disk storage 1124 includes, but is not limited to, devices like a magnetic disk drive, floppy disk drive, tape drive, Jaz drive, Zip drive, LS-100 drive, flash memory card, or memory stick. In addition, disk storage 1124 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1124 to the system bus 1118, a removable or non-removable interface is typically used such as interface 1126.

It is to be appreciated that FIG. 11 describes software that acts as an intermediary between users and the basic computer resources described in suitable operating environment 1110. Such software includes an operating system 1128. Operating system 1128, which can be stored on disk storage 1124, acts to control and allocate resources of the computer system 1112. System applications 1130 take advantage of the management of resources by operating system 1128 through program modules 1132 and program data 1134 stored either in system memory 1116 or on disk storage 1124. It is to be appreciated that the present invention can be implemented with various operating systems or combinations of operating systems.

A user enters commands or information into the computer 1112 through input device(s) 1136. Input devices 1136 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1114 through the system bus 1118 via interface port(s) 1138. Interface port(s) 1138 include, for example, a serial port, a parallel port, a game port, and a universal serial bus (USB). Output device(s) 1140 use some of the same type of ports as input device(s) 1136. Thus, for example, a USB port can be used to provide input to computer 1112, and to output information from computer 1112 to an output device 1140. Output adapter 1142 is provided to illustrate that there are some output devices 1140 like monitors, speakers, and printers, among other output devices 1140, which require special adapters. The output adapters 1142 include, by way of illustration and not limitation, video and sound cards that provide a means of connection between the output device 1140 and the system bus 1118. It should be noted that other devices and/or systems of devices provide both input and output capabilities such as remote computer(s) 1144.

Computer 1112 can operate in a networked environment utilizing logical connections to one or more remote computers, such as remote computer(s) 1144. The remote computer(s) 1144 can be a personal computer, a server, a router, a network PC, a workstation, a microprocessor based appliance, a peer device or other common network node and the like, and typically includes many or all of the elements described relative to computer 1112. For purposes of brevity, only a memory storage device 1146 is illustrated with remote computer(s) 1144. Remote computer(s) 1144 is logically connected to computer 1112 through a network interface 1148 and then physically connected via communication connection 1150. Network interface 1148 encompasses communication networks such as local-area networks (LAN) and wide-area networks (WAN). LAN technologies include Fiber Distributed Data Interface (FDDI), Copper Distributed Data Interface (CDDI), Ethernet/IEEE 1102.3, Token Ring/IEEE 1102.5 and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1150 refers to the hardware/software employed to connect the network interface 1148 to the bus 1118. While communication connection 1150 is shown for illustrative clarity inside computer 1112, it can also be external to computer 1112. The hardware/ software necessary for connection to the network interface 1148 includes, for exemplary purposes only, internal and external technologies such as, modems including regular telephone grade modems, cable modems and DSL modems, ISDN adapters, and Ethernet cards.

FIG. 12 is a schematic block diagram of a sample-computing environment 1200 with which the present invention can interact. The system 1200 includes one or more client(s) 1210. The client(s) 1210 can be hardware and/or software (e.g., threads, processes, computing devices). The system 1200 also includes one or more server(s) 1230. The server(s) 1230 can also be hardware and/or software (e.g., threads, processes, computing devices). The servers 1230 can house threads to perform transformations by employing the present invention, for example. One possible communication between a client 1210 and a server 1230 can be in the form of a data packet adapted to be transmitted between two or more computer processes. The system 1200 includes a communication framework 1250 that can be employed to facilitate communications between the client(s) 1210 and the server(s) 1230. The client(s) 1210 are operably connected to one or more client data store(s) 1260 that can be employed to store information local to the client(s) 1210. Similarly, the server(s) 1230 are operably connected to one or more server data store(s) 1240 that can be employed to store information local to the servers 1230.

What has been described above comprises examples of the present invention. It is, of course, not possible to describe every conceivable combination of components or methodologies for purposes of describing the present invention, but one of ordinary skill in the art can recognize that many further combinations and permutations of the present invention are possible. Accordingly, the present invention is intended to embrace all such alterations, modifications and variations that fall within the spirit and scope of the appended claims. Furthermore, to the extent that the term "comprises" is used in either the detailed description or the claims, such term is intended to be inclusive in a manner similar to the term "comprising" as "comprising" is interpreted when employed as a transitional word in a claim.

What is claimed is:

1. A method for providing resolution enhancement of a feature on an imprint mask, comprising:
   monitoring an imprint mask in real time;
   detecting a resolution enhancement need of a feature on the imprint mask based at least in part upon the real time monitoring of the imprint mask, the resolution enhancement need is identified by a gap spacing for the feature being shorter than a target gap spacing; and
   compensating for the resolution enhancement need of the feature on the imprint mask with a trim etch to increase the gap spacing for the feature, a width of the feature on the imprint mask is compensated with the trim etch while maintaining a height of such feature.

2. The method of claim 1, the trim etch is at least one of a dry etch process or a wet etch process.

3. The method of claim 1, further comprising selectively etching the feature on the imprint mask that includes a detected resolution enhancement need, the selective etching decreases the feature size without affecting a disparate feature on the imprint mask.

4. The method of claim 1, further comprising:
   utilizing a scatterometry system for monitoring to detect feature size and the associated resolution on the imprint mask;
   determining at least one of:
      whether a resolution enhancement need is necessary based on a deviation from a target critical dimension of the feature;
      whether a resolution enhancement need will be potentially detrimental to a wafer associated with the feature; or
      whether the compensation on the feature successfully increased resolution of the feature on the imprint mask; and
   initiating the resolution enhancement based at least in part upon the determination at an instance, the instance is at least one of during a fabrication of a wafer or prior to imprinting a wafer.

5. The method of claim 1, further comprising making inferences regarding a portion of the imprint mask, the inference is based upon at least one of information related to a severity of an inefficient resolution of the feature, information related to a current resolution of the feature, a location of the feature on the imprint mask, or information gleaning an impact of the inefficient resolution of the feature has on a wafer.

6. The method of claim 5, further comprising implementing a trim etch to the feature based at least in part upon the inference.

7. The method of claim 1, further comprising generating feedback for controlling at least one parameter associated with at least one of monitoring the imprint mask or compensating for an imprint mask resolution enhancement need.

8. The method of claim 1, further comprising employing grid-mapping to the imprint mask to generate a plurality of sections.

9. The method of claim 8, further comprising creating a library of grid-map sections that are non-critical to facilitate a decision regarding initiating compensatory action to mitigate a detected imprint mask resolution enhancement need, a portion of the grid-map section with a non-critical defect is a lower priority for compensatory action in comparison to a portion of the grid-map section with a critical defect.

10. A method for providing resolution enhancement of a feature on an imprint mask, comprising:
    monitoring an imprint mask in situ to detect an imprint mask resolution enhancement need, the need is based upon at least one of a resolution increase request, a resolution transgression, or a comparison between an achieved resolution of the feature versus a target resolution of the feature; and
    selectively compensating the feature with a trim etch based on the imprint mask resolution enhancement need.

11. The method of claim 10, further comprising:
    determining whether detected imprint mask resolution enhancement need has been sufficiently mitigated within a threshold of error related to a target feature size and an achieved feature size; and
    performing a trim etch on the feature based upon the determination, the trim etch shrinks the imprint mask feature size to allow for an increase in a resolution of the imprint mask and a reduction for a contact hole.

12. The method of claim 10, further comprising monitoring data associated with at least one physical parameter of the imprint mask.

13. The method of claim 10, the means for selectively compensating for the imprint mask resolution enhancement need utilizing at least one of a wet trim etch process or a dry trim etch process.

14. The method of claim 10, further comprising generating feedback data for controlling at least one parameter associated with the means for monitoring the imprint mask and the means for selectively compensating for the imprint mask resolution enhancement need.

15. A method to facilitate increasing a resolution associated with an imprint mask, comprising:
   implementing a first trim etch on a feature on the imprint mask to achieve a target gap spacing;
   evaluating the feature on the imprint mask in real time;
   comparing an achieved gap spacing of the feature to the target gap spacing associated with the feature;
   determining if the achieved gap spacing is within a tolerated threshold of error; and
   performing a second trim etch on the feature to increase the achieved gap spacing based on the determination.

16. The method of claim 15, further comprising:
   identifying the location of the feature on the imprint mask; and
   determining if the location of the feature is in at least one of a critical area of the imprint mask or a non-critical area of the imprint mask.

17. The method of claim 16, further comprising:
   performing the second trim etch on the feature within the critical area of the imprint mask; and
   foregoing the second trim etch on the feature within the non-critical area of the imprint mask.

18. The method of claim 15, the trim etch is at least one of a wet etch or a dry etch.

19. The method of claim 15, the imprint mask is a portion of quarts material.

20. The method of claim 15, further comprising providing an inference related to at least one of the feature, the imprint mask, the trim etch, or a characteristic of the imprint mask.

21. The method of claim 20, the inference relates to at least one of an optimal duration for employing the trim etch, an optimal trim etch process to employ, an amount of trim etch to perform on the imprint mask, or an affect the imprint mask has on a wafer.

22. The method of claim 15, further comprising evaluating the feature on the imprint mask and a resolution associated therewith out a cross-sectional image of the imprint mask.

* * * * *